United States Patent
Choi et al.

(10) Patent No.: US 7,800,104 B2
(45) Date of Patent: Sep. 21, 2010

(54) ARRAY SUBSTRATE FOR LIQUID CRYSTAL DISPLAY DEVICE AND METHOD OF FABRICATING THE SAME

(75) Inventors: Nack-Bong Choi, Uiwang-si (KR); Hyun-Sik Seo, Annyang-si (KR)

(73) Assignee: LG Display Co., Ltd., Seoul (KR)

( * ) Notice: Subject to any disclaimer, the term of this patent is extended or adjusted under 35 U.S.C. 154(b) by 189 days.

(21) Appl. No.: 11/819,718

(22) Filed: Jun. 28, 2007

(65) Prior Publication Data

US 2008/0035917 A1    Feb. 14, 2008

(30) Foreign Application Priority Data

Aug. 11, 2006    (KR) ...................... 10-2006-0076348

(51) Int. Cl.
*H01L 29/08* (2006.01)
(52) U.S. Cl. ................ 257/40; 257/E27.132; 438/30
(58) Field of Classification Search ................ 257/40, 257/E27.132; 438/30
See application file for complete search history.

(56) References Cited

U.S. PATENT DOCUMENTS

| | | | | |
|---|---|---|---|---|
| 5,508,765 A * | 4/1996 | Nakagawa et al. | ............ | 349/42 |
| 6,222,600 B1 * | 4/2001 | Hirano | ........................ | 349/113 |
| 7,342,247 B2 * | 3/2008 | Lee et al. | ...................... | 257/40 |
| 7,489,368 B2 * | 2/2009 | Kim et al. | ..................... | 349/43 |
| 2005/0139836 A1 * | 6/2005 | Oh | .............................. | 257/72 |
| 2006/0097261 A1 * | 5/2006 | Yang | ........................... | 257/66 |

* cited by examiner

*Primary Examiner*—Wael M Fahmy
*Assistant Examiner*—John C Ingham
(74) *Attorney, Agent, or Firm*—McKenna Long & Aldridge LLP

(57) ABSTRACT

An array substrate for a liquid crystal display device includes: a data line on a substrate; a source electrode contacting the data line, a drain electrode spaced apart from the source electrode and a pixel electrode connected to the drain electrode, wherein the source electrode, the drain electrode and the pixel electrode each including a transparent conductive material; an organic semiconductor layer contacting the source and drain electrodes; a gate insulating layer on the organic semiconductor layer; a gate electrode on the gate insulating layer; a first passivation layer on the gate electrode, the first passivation layer having a gate contact hole exposing the gate electrode; and a gate line on the first passivation layer, the gate line connected to the gate electrode through the gate contact hole.

20 Claims, 12 Drawing Sheets

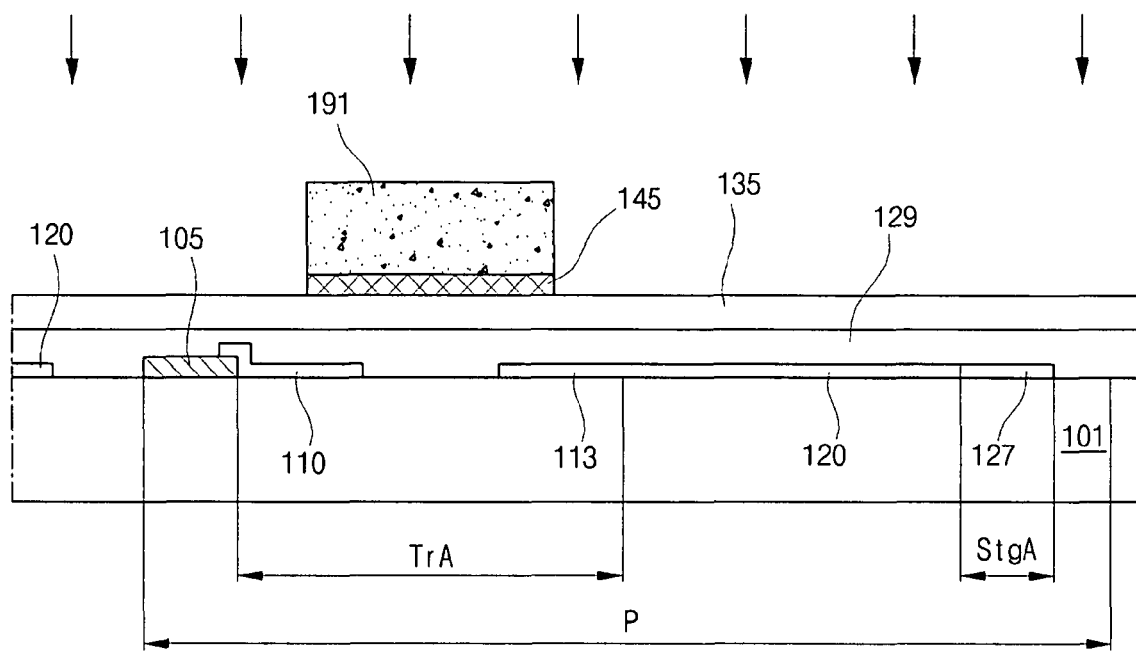

ARRAY SUBSTRATE FOR LIQUID CRYSTAL DISPLAY DEVICE AND METHOD OF FABRICATING THE SAME

The present invention claims the benefit of Korean Patent Application No. 2006-0076348, filed in Korea on Aug. 11, 2006, which is hereby incorporated by reference for all purposes as if fully set forth herein.

FIELD OF THE INVENTION

The present invention relates to an array substrate for a liquid crystal display device, and more particularly, to an array substrate including an organic semiconductor layer and a method of fabricating the array substrate.

DISCUSSION OF THE RELATED ART

Until recently, display devices have typically used cathode-ray tubes (CRTs). More recently, considerable effort has been expended to research and develop thin film transistor liquid crystal display (TFT-LCD) devices having thin profiles, light weight and low power consumption as substitutes for CRTs.

Liquid crystal display (LCD) devices use the optical anisotropy and polarization properties of liquid crystal molecules of a liquid crystal layer to produce an image. The liquid crystal molecules have long and thin shapes, and because of the optical anisotropy property, the polarization of light varies with the alignment direction of the liquid crystal molecules. The alignment direction of the liquid crystal molecules can be controlled by varying the intensity of an electric field applied to the liquid crystal layer. Accordingly, a typical LCD device includes two substrates spaced apart and facing each other and a liquid crystal layer interposed between the two substrates. Each of the two substrates includes an electrode on a surface facing the other of the two substrates. A voltage is applied to each electrode to induce an electric field between the electrodes and the arrangement of the liquid crystal molecules as well as the transmittance of light through the liquid crystal layer is controlled by varying the intensity of the electric field. LCD devices are non-emissive type display devices that employ a light source to display images using the change in light transmittance.

Among the various types of LCD devices, active matrix LCD (AM-LCD) devices that employ switching elements and pixel electrodes arranged in a matrix structure are the subject of significant research and development because of their high resolution and superior suitability for displaying moving images. Thin film transistor LCD (TFT-LCD) devices use thin film transistors (TFTs) as the switching elements.

FIG. 1 is a perspective view of an LCD device according to the related art. As shown in FIG. 1, the LCD device of the related art includes a first substrate 10, a second substrate 20 and a liquid crystal layer 30. The first substrate 10 is referred to as an array substrate and includes a gate line 14 and a data line 16 crossing each other to define a pixel region "P." A pixel electrode 18 and a thin film transistor (TFT) "T," as a switching element, are positioned in each pixel region "P." Thin film transistors "T," which are disposed adjacent to crossings of the gate lines 14 and the data lines 16 are disposed in a matrix on the first substrate 10. The second substrate 20 is referred to as a color filter substrate, and includes color filter layer 26 including red (R), green (G) and blue (B) color filters 26a, 26b and 26c, a black matrix 25 between the red, green and blue color filters 26a, 26b and 26c and a common electrode 28 on both the color filter layer 26 and the black matrix 25.

Although not shown in FIG. 1, the first and second substrates 10 and 20 are attached with a seal pattern to prevent leakage of liquid crystal layer 30. In addition, a first alignment layer is formed between the first substrate 10 and the liquid crystal layer 30 and a second alignment layer is formed between the second substrate 20 and the liquid crystal layer 30 to align the liquid crystal molecules in the liquid crystal layer 30 along an initial alignment direction. A polarization plate is formed on an outer surface of at least one of the first and second substrates 10 and 20.

Further, a backlight unit (not shown) disposed under the first substrate 10 supplies light. A gate signal turning the TFT "T" on is sequentially applied to each of the gate lines 14, and an image signal on the data line 16 is applied to the pixel electrode 18 in the pixel region "P." The liquid crystal molecules in the liquid crystal layer 30 are driven by a vertical electric field generated between the pixel electrode 18 and the common electrode 28 to display images by varying the light transmittance of the liquid crystal molecules.

In the above related art LCD device, hard type substrates (e.g. glass substrates) have been used as the first and second substrates. As smaller, portable display devices such as personal digital assistants (PDA) and notebook computers have become more widely used, much effort has being expended to research and develop flexible substrates made of materials such as plastic and having low weight and good flexibility. However, fabrication processes for array substrates including TFTs use temperatures greater than 200° C., making it difficult to make flexible TFT substrates as substitutes for glass TFT substrates. Accordingly, LCD displays often employ a flexible substrate as the color filter substrate and a hard type glass substrate as the array substrate.

When fabricating a TFT or array substrate using temperatures of 200° C. and lower, electrodes and lines made of a metallic material, an insulating layer, a passivation layer and the like can be formed with a relatively low temperature deposition or coating without compromising the properties of the TFT. However, when a semiconductor layer using amorphous silicon or polycrystalline silicon is formed at temperatures of 200° C. and lower, the semiconductor properties including electric conductivity are degraded and the resulting TFTs are defective. Accordingly, a TFT employing such a semiconductor layer cannot function as a switching element.

To solve the above problems, efforts have been expended to research and develop methods for fabricating a TFT and an array substrate at temperatures of 200° C. and lower using an organic semiconductor material.

FIG. 2 is a cross-sectional view showing an array substrate for an LCD device using an organic semiconductor layer according to the related art. FIG. 2 shows a semiconductor layer and a gate insulating layer of an array substrate without showing the subsequently formed layers. A source electrode 55, a drain electrode 57 and a data line (not shown) are formed on a substrate 51 by depositing and patterning a material such as gold (Au) having a relatively high work function. The substrate 51 includes plastic or glass and the source and drain electrodes 55 and 57 are spaced apart from each other. The source electrode 55 is connected to the data line. A pixel electrode 60 is formed on the drain electrode 57 by depositing and patterning a transparent conductive material, and an organic semiconductor layer 63 is formed on the source and drain electrodes 55 and 57 by depositing an organic semiconductor material using a shadow mask or by coating a liquid organic semiconductor material. Subsequently, a gate insulating layer 67 is formed on the organic semiconductor layer 63.

Gold (Au) is typically used for the source electrode 55, the drain electrode 57 and the data line because of gold's relatively high work function and relatively low resistance. For example, silver (Ag), aluminum (Al) and copper (Cu) have work functions of about 4.26 eV (electron-volts), about 4.28 eV and about 4.65 eV, respectively, while gold (Au) has a work function of about 5.1 eV. The organic semiconductor material may include one or more of pentacene and polythiophene. The interface between the organic semiconductor layer and the source and drain electrodes generates an energy barrier. It has been demonstrated experimentally that the size of the energy barrier decreases as the work function difference between the organic semiconductor layer and the source and drain electrodes increases. By using gold (Au), a metal having a work function significantly higher than the other metallic materials such as silver (Ag), aluminum (Al) and copper (Cu), the energy barrier is reduced, and the performance of a thin film transistor employing the organic semiconductor layer is improved.

However, since gold (Au) has a tendency to diffuse, it is difficult to obtain designed line widths for the source and drain electrodes and the data line using gold. In addition, when gold (Au) is deposited in a process chamber, the metal is also deposited onto the inner wall of the process chamber. The gold (Au) deposited on the inner wall of the process chamber becomes a contaminant that deposits onto other substrates as a contaminant in subsequent processes. Further, gold (Au) is an expensive material that increases the product cost.

SUMMARY OF THE INVENTION

Accordingly, the present invention is directed to an array substrate for a liquid crystal display device and a method of fabricating the array substrate that substantially obviates one or more problems due to limitations and disadvantages of the related art.

An advantage of the present invention is to provide an array substrate for a liquid crystal display device and a method of fabricating the array substrate where a fabrication process is simplified and a production cost is reduced.

Another advantage of the present invention is to provide an array substrate for a liquid crystal display device and a method of fabricating the array substrate where a thin film transistor is formed by using indium-tin-oxide (ITO) having a relatively high work function.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes: a data line on a substrate; a source electrode contacting the data line, a drain electrode spaced apart from the source electrode and a pixel electrode connected to the drain electrode, wherein the source electrode, the drain electrode and the pixel electrode each include transparent conductive material; an organic semiconductor layer contacting the source and drain electrodes; a gate insulating layer on the organic semiconductor layer; a gate electrode on the gate insulating layer; a first passivation layer on the gate electrode, the first passivation layer having a gate contact hole exposing the gate electrode; and a gate line on the first passivation layer, the gate line connected to the gate electrode through the gate contact hole.

In another aspect of the present invention, a method of fabricating an array substrate for a liquid crystal display device includes: forming a data line on a substrate; forming a source electrode contacting the data line, a drain electrode spaced apart from the source electrode and a pixel electrode extending from the drain electrode, wherein the source electrode, the drain electrode and the pixel electrode each include a transparent conductive material; forming an organic semiconductor layer contacting the source and drain electrodes, a gate insulating layer on the organic semiconductor layer and a gate electrode on the gate insulating layer; forming a first passivation layer on the gate electrode, the first passivation layer having a gate contact hole exposing the gate electrode; and forming a gate line on the first passivation layer, the gate line connected to the gate electrode through the gate contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 6A to 6F are cross-sectional views, which are taken along a line "IV-IV" of FIG. 3, illustrating a method of fabricating an array substrate for a liquid crystal display device according to an embodiment of the present invention.

DETAILED DESCRIPTION OF THE ILLUSTRATED EMBODIMENTS

Reference will now be made in detail to the illustrated embodiments of the present invention, which are illustrated in the accompanying drawings.

Figure 1:
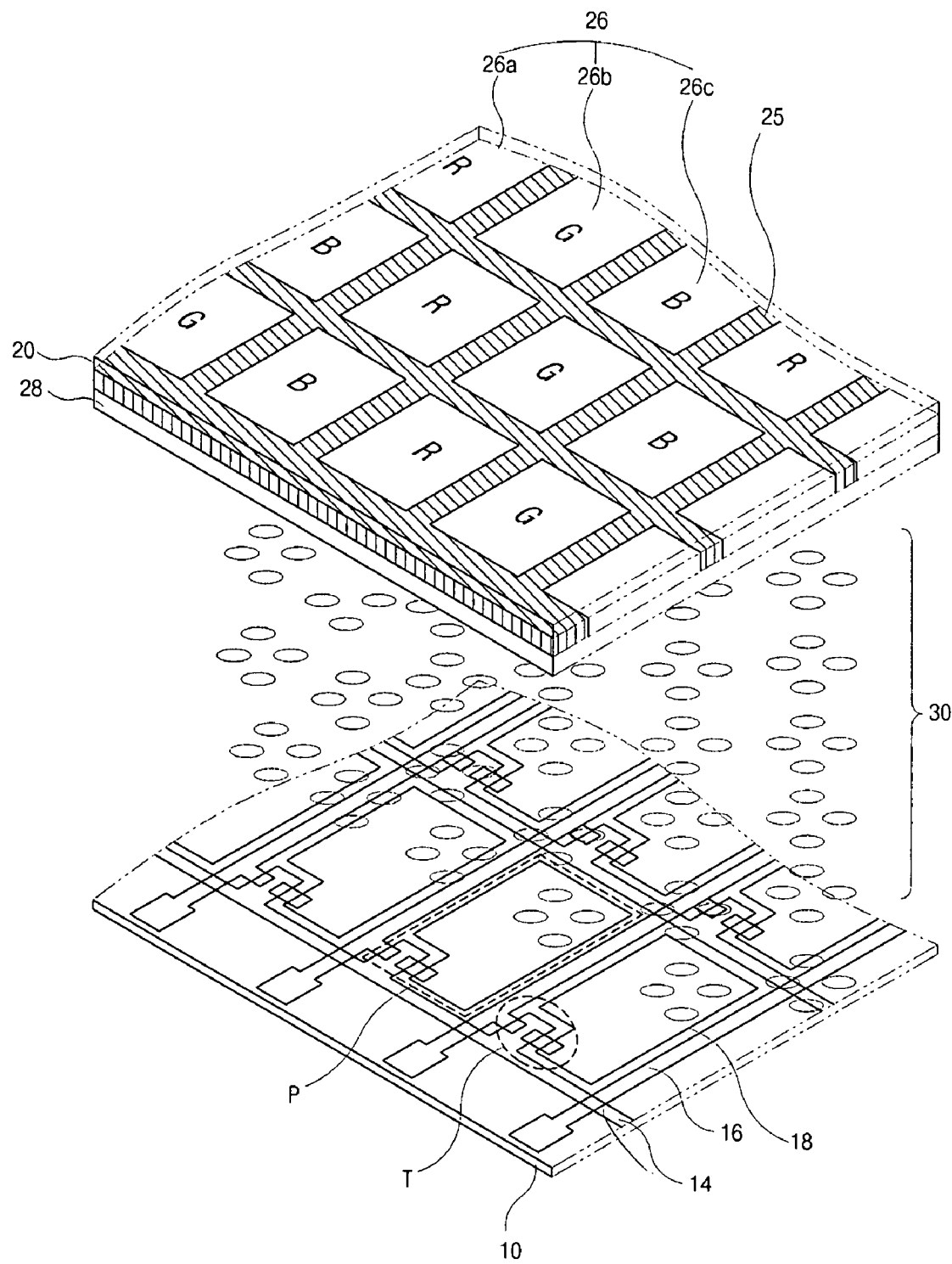
FIG. 1 is a perspective view of an LCD device according to the related art.
Figure 2:
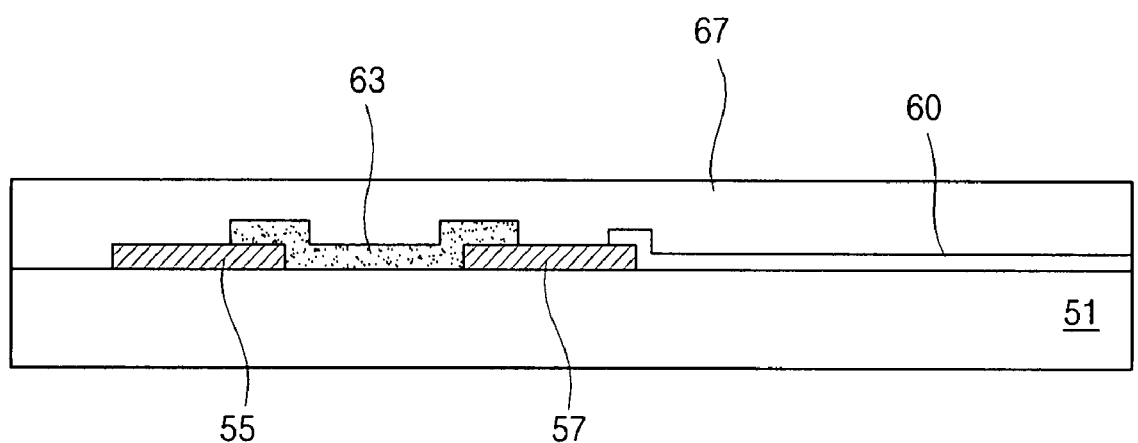
FIG. 2 is a cross-sectional view showing an array substrate for an LCD device using an organic semiconductor layer according to the related art.
Figure 3:
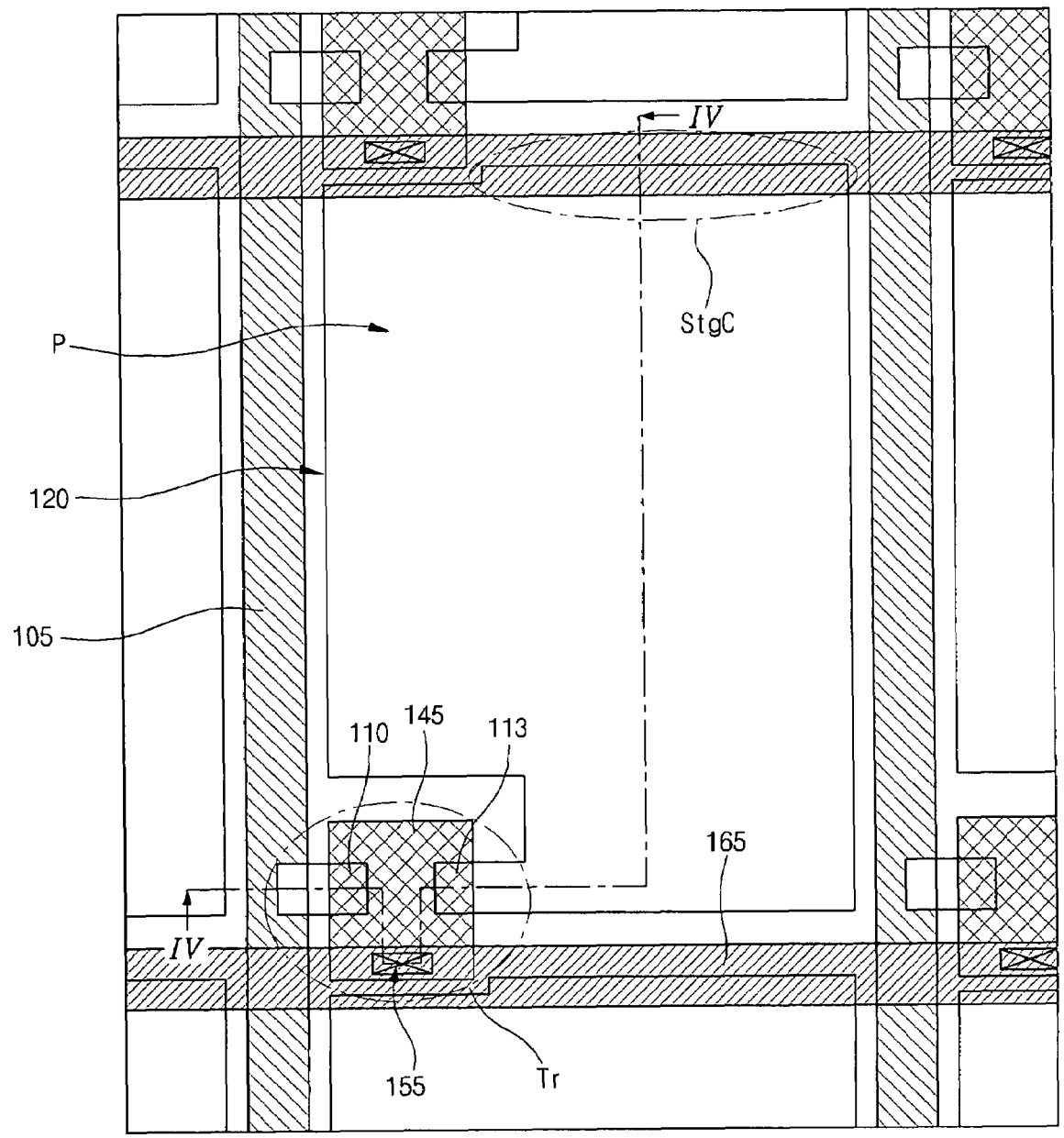
FIG. 3 is a plan view showing an array substrate according to an embodiment of the present invention.
Figure 4:
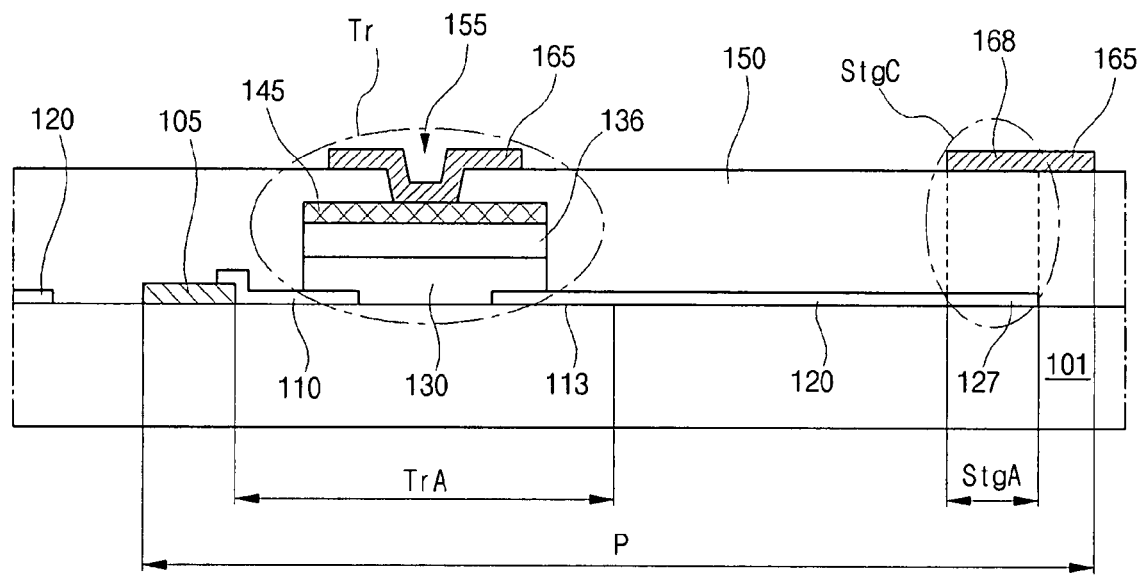
FIG. 4 is a cross-sectional view taken along a line "IV-IV" of FIG. 3.
Figure 5:
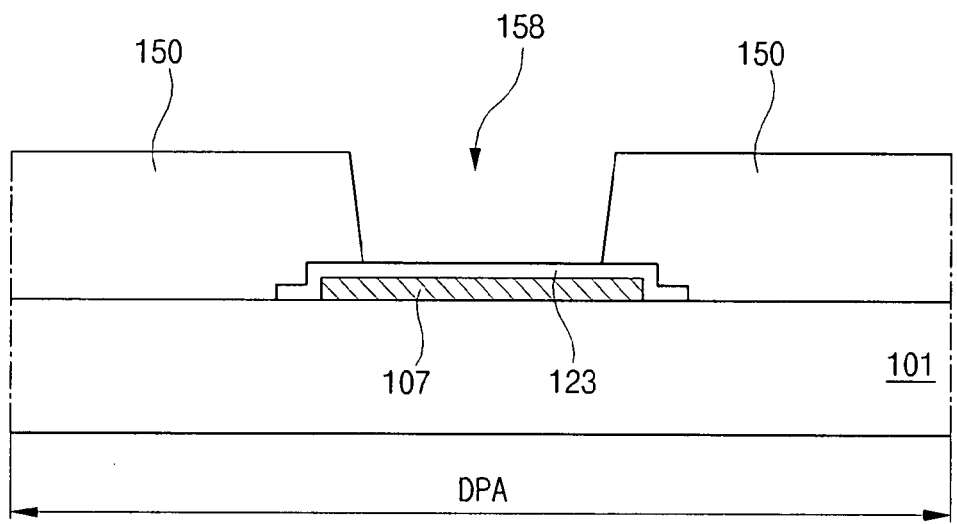
FIG. 5 is a cross-sectional view showing a data pad area of an array substrate according to an embodiment of the present invention.

FIG. 3 is a plan view showing an array substrate according to an embodiment of the present invention, FIG. 4 is a cross-sectional view taken along a line "IV-IV" of FIG. 3, and FIG. 5 is a cross-sectional view showing a data pad area of an array substrate according to an embodiment of the present invention. In FIGS. 3, 4 and 5, a pixel region "P" includes a transistor area "TrA" where a thin film transistor (TFT) is formed as a switching element and a storage area "StgA" where a storage capacitor is formed.

As shown in FIG. 3, a data line 105 and a gate line 165 are formed on a substrate 101. The substrate 101 includes a glass or a plastic material. The data line 105 and the gate line 165 cross each other to define a pixel region "P." In addition, a thin film transistor (TFT) "Tr" connected to the data line 105 and the gate line 165 is formed on the substrate 101. The TFT "Tr" includes a source electrode 110, a drain electrode 113, an organic semiconductor layer as an active layer, a gate insulating layer, and a gate electrode 145. The data line 105, the gate electrode 145 and the gate line 165 include a first metallic material, a second metallic material and a third metallic material respectively, each metallic material having a relatively low resistance. The source electrode 110 is connected to the data line 105, and a pixel electrode 120 is connected to the drain electrode 113. The source electrode 110 contacts the data line 105, and the pixel electrode 120 extends from the drain electrode 113. The source electrode 110, the drain electrode 113 and the pixel electrode 120 each include a material such as indium-tin-oxide (ITO) having a work function higher than a work function of a metallic material included in the data line 105. The pixel electrode 120 formed of the same layer as the drain electrode 113 in the pixel region "P" and overlaps the gate line 165 in an adjacent pixel region "P" that may be referred to as a previous gate line, to form a storage capacitor "StgC." The previous gate line 165 and the pixel electrode 120 function as a first capacitor electrode and a second capacitor electrode respectively for the storage capacitor "StgC."

Referring to FIGS. 4 and 5, a data line 105 and a data pad 107 are formed on a substrate 101 that includes one of a glass and a plastic material. The data line 105 and the data pad 107 include a first metallic material such as silver (Ag), aluminum (Al), aluminum (Al) alloy, molybdenum (Mo), copper (Cu), copper (Cu) alloy and chromium (Cr). The data pad 107 is connected to one end of the data line 105 and is formed in a data pad area "DPA."

In addition, a source electrode 110, a drain electrode 113, a pixel electrode 120 and a data pad terminal 123 are formed on the data line 105, the data pad 107 and the substrate 101. The source electrode 110, the drain electrode 113, the pixel electrode 120 and the data pad terminal 123 each include a transparent conductive material such as indium-tin-oxide (ITO). The transparent conductive material for the source electrode 110, the drain electrode 113, the pixel electrode 120 and the data pad terminal 123 has a higher work function than the first metallic material for the data line 105. The source electrode 110 and the drain electrode 113 are disposed in the switching area "TrA," and the pixel electrode 120 is disposed in the pixel region "P." The source electrode 110 contacts the data line 105, and the pixel electrode 120 extends from the drain electrode 113 spaced apart from the source electrode 110. The data pad terminal 123 contacts and completely covers the data pad 107.

An organic semiconductor layer 130, a gate insulating layer 136 and a gate electrode 145 of a second metallic material are sequentially formed in the switching area "TrA" on the source and drain electrodes 110 and 113 and the substrate 101 exposed between the source and drain electrodes 110 and 113. The organic semiconductor layer 130, the gate insulating layer 136 and the gate electrode 145 are formed using a single mask process to have the same or substantially the same shape as one another.

A passivation layer 150 of an organic insulating material is formed on the entire surface of the substrate 101 including the gate electrode 145. Accordingly, the passivation layer 150 covers the gate electrode 145, the source electrode 110 and the drain electrode 113 in the switching area "TrA," the pixel electrode 120 in the pixel region "P" and the data pad terminal in the data pad area "DPA." In addition, the passivation layer 150 includes a gate contact hole 155 exposing the gate electrode 145 in the switching area "TrA" and a data pad contact hole 158 exposing the data pad terminal 123 in the data pad area "DPA."

A gate line 165 of a third metallic material is formed on the passivation layer 150. The gate line 165 is connected to the gate electrode 145 through the gate contact hole 155. Although not shown in FIGS. 4 and 5, the gate line 165 crosses the data line 105 to define the pixel region "P," and a gate pad is formed at one end of the gate line 165 in a gate pad area. Further, the gate line 165 corresponding to an adjacent pixel region, and that may be referred to as a previous gate line, overlaps the pixel electrode 120 in the pixel region "P" to form a storage capacitor "StgC." Accordingly, the storage capacitor "StgC" includes a first capacitor electrode 127 that is an overlapped portion of the pixel electrode 120, a dielectric layer that is a portion of the passivation layer 150 and a second capacitor electrode 168 that is an overlapped portion of the previous gate line.

In the array substrate 101 for an LCD device, the source and drain electrodes 110 and 113 contacting the organic semiconductor layer 130 are formed of a transparent conductive material such as indium-tin-oxide (ITO) in lieu of using gold (Au). Although indium-tin-oxide (ITO) has a lower work function than gold (Au), indium-tin-oxide (ITO) has a much higher work function than other metallic materials. As a result, degradation in the operating characteristics of the TFT "Tr" may be reduced while reducing production costs.

FIGS. 6A to 6F and FIGS. 7A to 7F are cross-sectional views illustrating a method of fabricating an array substrate for a liquid crystal display device according to an embodiment of the present invention. FIGS. 6A to 6F are views taken along a line "IV-IV" of FIG. 3, and FIGS. 7A to 7F are views showing a data pad area of the array substrate.

Figure 6A:
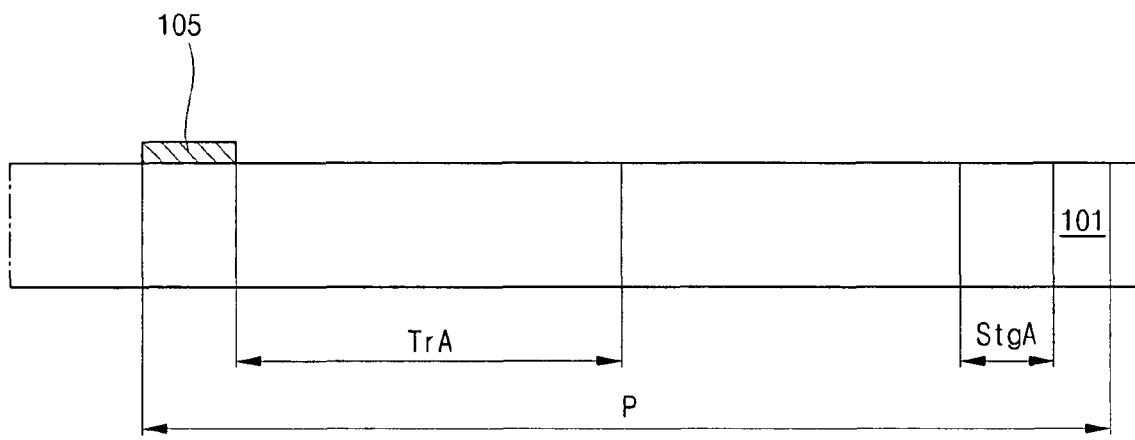
Figure 7A:
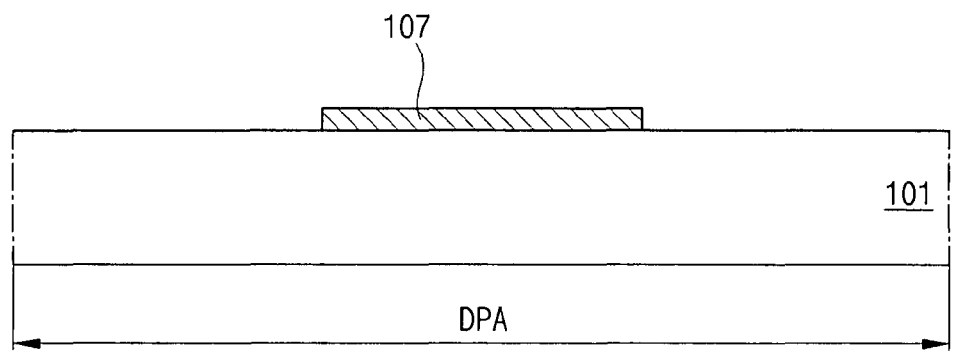
FIGS. 7A to 7F are cross-sectional views illustrating a method of fabricating an array substrate in a data pad area for a liquid crystal display device according to an embodiment of the present invention.

Referring first to FIGS. 6A and 7A, a first metallic material layer is formed on a substrate 101 by depositing a first metallic material such as silver (Ag), aluminum (Al), aluminum (Al) alloy, molybdenum (Mo), copper (Cu), copper (Cu) alloy or chromium (Cr). The substrate 101 includes one of plastic and glass materials and the first metallic material may be deposited onto the substrate 101 using a sputtering method at a temperature below about ° C. After a photoresist (PR) layer is formed on the first metallic material layer, the PR layer is formed into a PR pattern through a photolithographic process including exposure and development, and the first metallic material layer is patterned using the PR pattern as an etch mask to form a data line 105 and a data pad 107. After the data line 105 and the data pad 107 are formed, the PR pattern is removed using stripping process as a wet method or an ashing process as a dry method. The data pad 107 in the data pad area "DPA" extends from the data line 105.

Although not shown in FIGS. 6A and 7A, before the first metallic material layer is formed, a buffer layer of an insulating material such as silicon oxide ($SiO_2$) may be formed on the substrate 101. By using a buffer layer having a hydrophilic property and having an excellent adhesion property, adhesion between the substrate 101 and an organic semiconductor layer 130 (of FIG. 6D) is improved, and the organic semiconductor layer 130 (of FIG. 6D) may be formed to have a uniform thickness.

Figure 6B:
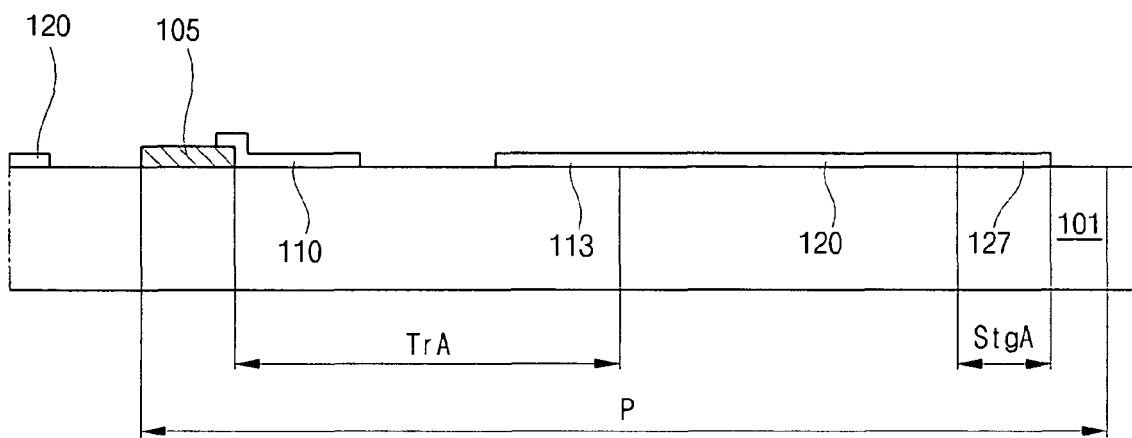
Figure 7B:
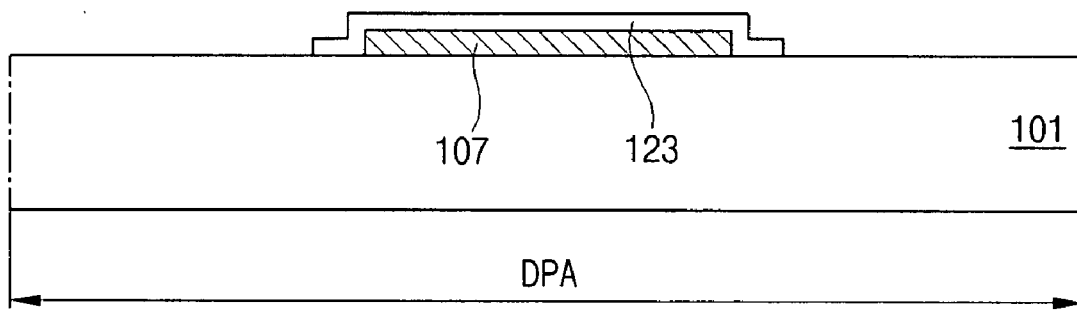

Referring to FIGS. 6B and 7B, a transparent conductive material layer is formed on the data line 105 and the data pad 107 by depositing a transparent conductive material such as indium-tin-oxide (ITO). The transparent conductive material has a higher work function (i.e. the energy required to remove an electron from the material surface) than the first metallic material. A source electrode 110, a drain electrode 113, a pixel electrode 120 and a data pad terminal 123 are formed by patterning the transparent conductive material layer. The source and drain electrodes 110 and 113 are formed in the switching area "TrA," while the data pad terminal 123 is disposed in the data pad area "DPA." The source electrode 110 contacts the data line 105 and the drain electrode 113 is spaced apart from the source electrode 110. In addition, the pixel electrode 120 in the pixel region "P" extends from the drain electrode 113. As a result, the source electrode 110, the drain electrode 113, the pixel electrode 120 and the data pad terminal 123 may be concurrently formed of the same material using a single mask process. In particular, the drain electrode 113 and the pixel electrode 120 may be formed as a single, integrated body of indium-tin-oxide (ITO).

The substrate 101 having the source and drain electrodes 110 and 113 formed thereon may be treated with an oxygen (02) plasma to increase a work function of indium-tin-oxide (ITO) material of the source and drain electrodes 110 and 113. For example, indium-tin-oxide (ITO) has a work function of about 4.8 eV to about 4.9 eV after an oxygen (O2) plasma treatment, while indium-tin-oxide (ITO) has a work function of about 4.6 eV when not subjected to an oxygen (O2) plasma treatment.

Figure 7C:
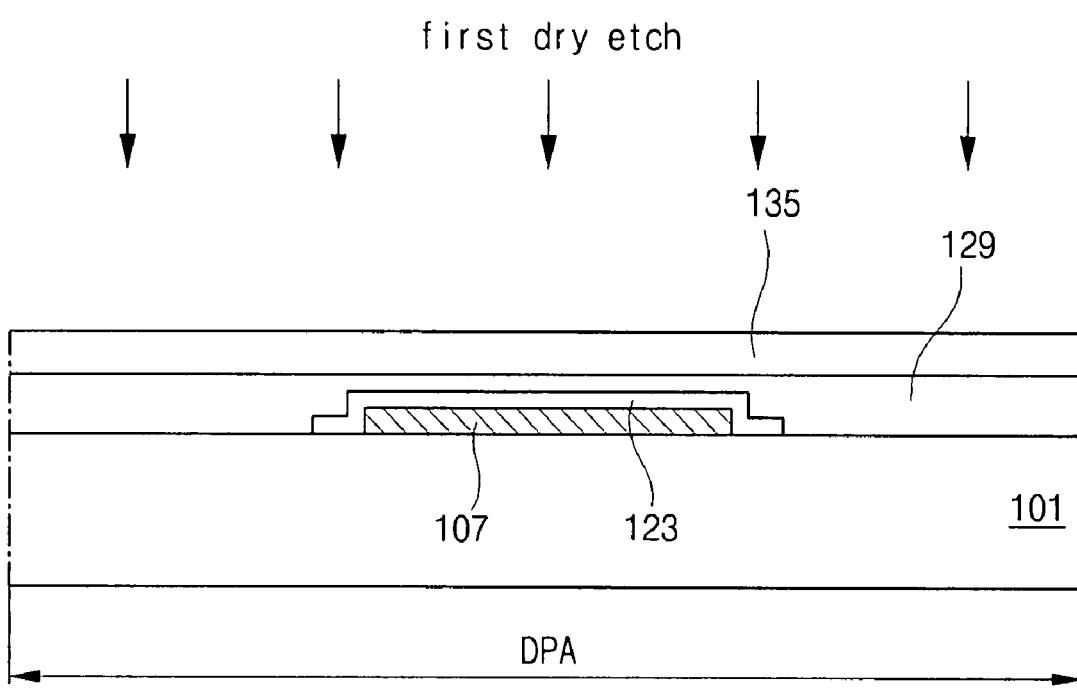

As shown in FIGS. 6C and 7C, an organic semiconductor material layer 129 and a gate insulating material layer 135 are sequentially formed on the source electrode 110, the drain electrode 113, the pixel electrode 120, the data pad terminal 123 and the exposed data line 105 on the substrate 101. The organic semiconductor material layer 129 is formed by coating a liquid organic semiconductor material. The liquid organic semiconductor material has a relatively high mobility and includes a relatively small molecule organic semiconductor material such as pentacene and polythiophene. The liquid organic semiconductor material may be coated using one of an inkjet coating method, a nozzle coating method, a bar coating method, a slit coating method, a spin coating method and a printing method. The gate insulating material layer 135 is formed by coating an organic insulating material such as a fluoropolymer material onto the substrate. The organic insulating material may be a material that does not react with and does not affect the organic semiconductor material layer 129 even when the organic insulating material contacts the organic semiconductor material layer 129.

A second metallic material layer is formed on the gate insulating material layer 135 by depositing a second metallic material such as molybdenum (Mo) and chromium (Cr). A photosensitive pattern 191 is formed on the second metallic material layer through a photolithographic process including exposure and development, and the second metallic material layer is patterned through a first dry etching step using the photosensitive pattern 191 as an etch mask to form a gate electrode 145. The photosensitive pattern 191 includes one of photoresist, photosensitive polyvinyl alcohol (PVA) and photo acryl.

Figure 6D:
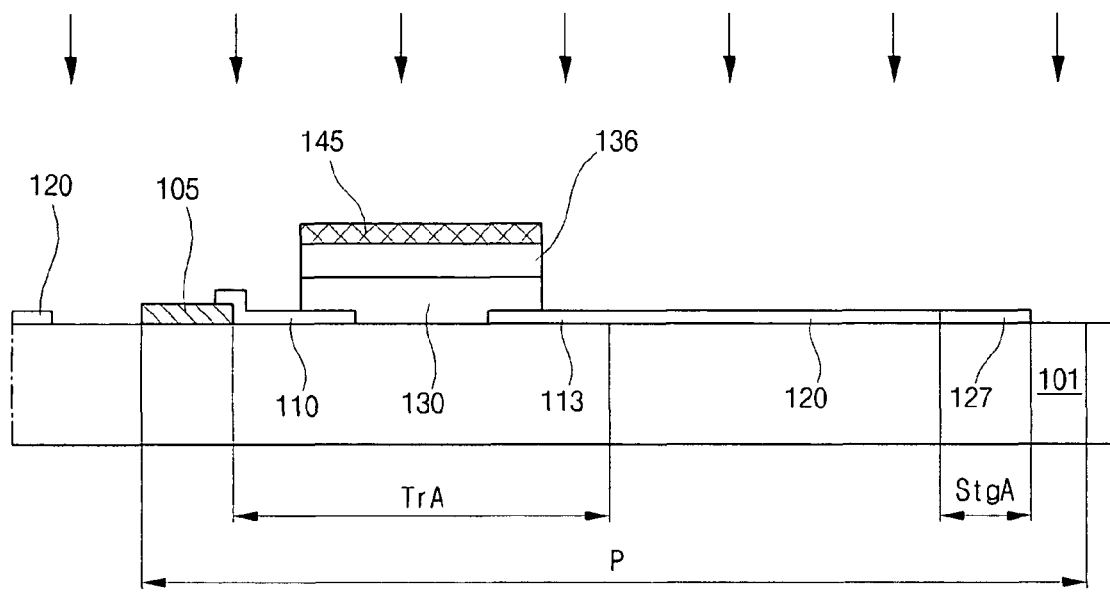
Figure 7D:
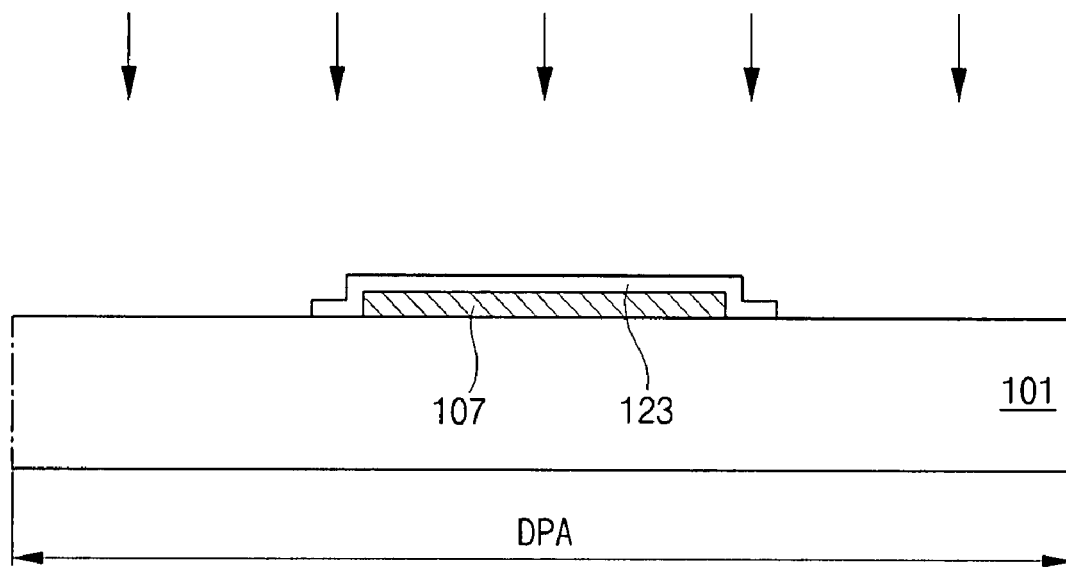

As shown in FIGS. 6D and 7D, the photosensitive pattern 191 (of FIG. 6C) is removed using a process such as a stripping process as a wet method or an ashing process as a dry method to expose the gate electrode 145. Next, the gate insulating material layer 135 (of FIG. 6C) and the organic semiconductor material layer 129 (of FIG. 6C) are patterned through a second dry etching step using the gate electrode 145 as an etch mask to form a gate insulating layer 136 and an organic semiconductor layer 130. Since the gate insulating layer 136 and the organic semiconductor layer 130 are formed using the gate electrode 145 as an etch mask, the gate insulating layer 136 and the organic semiconductor layer 130 have the same or substantially the same shape as the gate electrode 145.

In the illustrated embodiment of the present invention, the gate electrode 145 is formed through the first dry etching step and the gate insulating layer 136 and the organic semiconductor layer 130 are formed through the second dry etching step. In addition, the photosensitive pattern 191 is removed after the first dry etching step and before the second dry etching step without damage to the organic semiconductor layer 130. If the second metallic material layer, the gate insulating material layer 135 and the organic semiconductor material layer 129 are patterned through a single etching step using the photosensitive pattern 191 as an etch mask and the photosensitive pattern 191 is then removed through a stripping process, side surfaces of the organic semiconductor layer 130 may be exposed to a stripping solution and may become deteriorated. By forming the gate electrode 145, the gate insulating layer 136 and the organic semiconductor layer 130 through separate first and second dry etching steps, damage to the organic semiconductor layer 130 may be reduced or eliminated.

The data line 105, the pixel electrode 120 in the pixel region "P" and the data pad terminal 123 in the data pad area "DPA" are exposed as a result of the first and second etching steps. In addition, the source electrode 110, the drain electrode 113 spaced apart from the source electrode 110, the organic semiconductor layer 130 between the source and drain electrodes 110 and 113, the gate insulating layer 136 on the organic semiconductor layer 130 and the gate electrode 145 on the gate insulating layer 136 are formed in the switching area "TrA" through the first and second etching steps. The organic semiconductor layer 130 contacts the source and drain electrodes 110 and 113 and has an island shape, while the organic semiconductor layer 130, the gate insulating layer 136 and the gate electrode 145 have the same or substantially the same shape as one another. The source electrode 110, the drain electrode 113, the organic semiconductor layer 130, the gate insulating layer 136 and the gate electrode 145 are elements of the TFT "Tr" of a switching element.

Figure 6E:
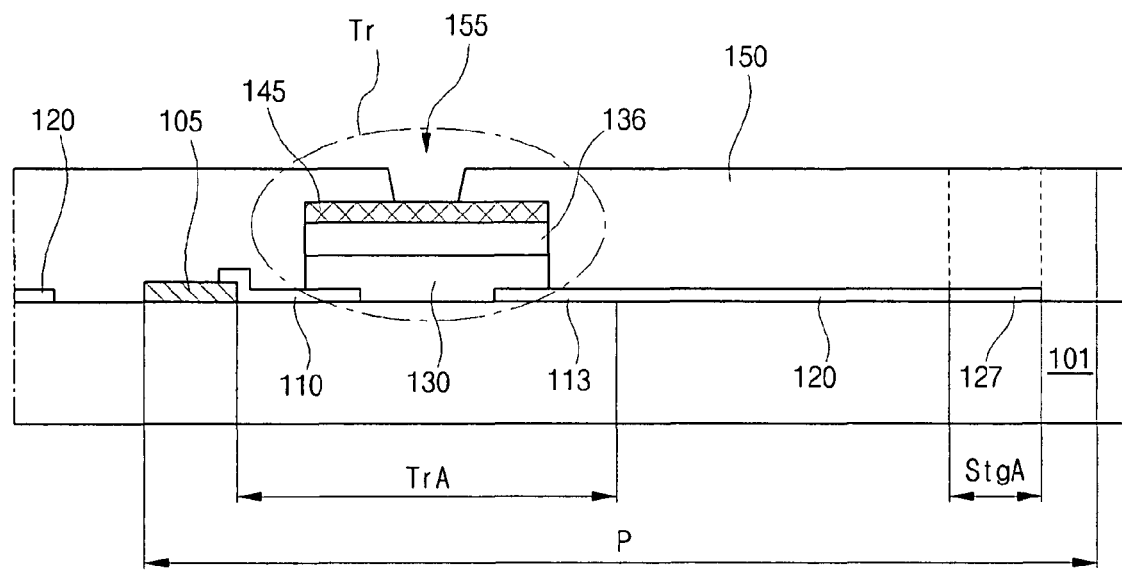
Figure 7E:
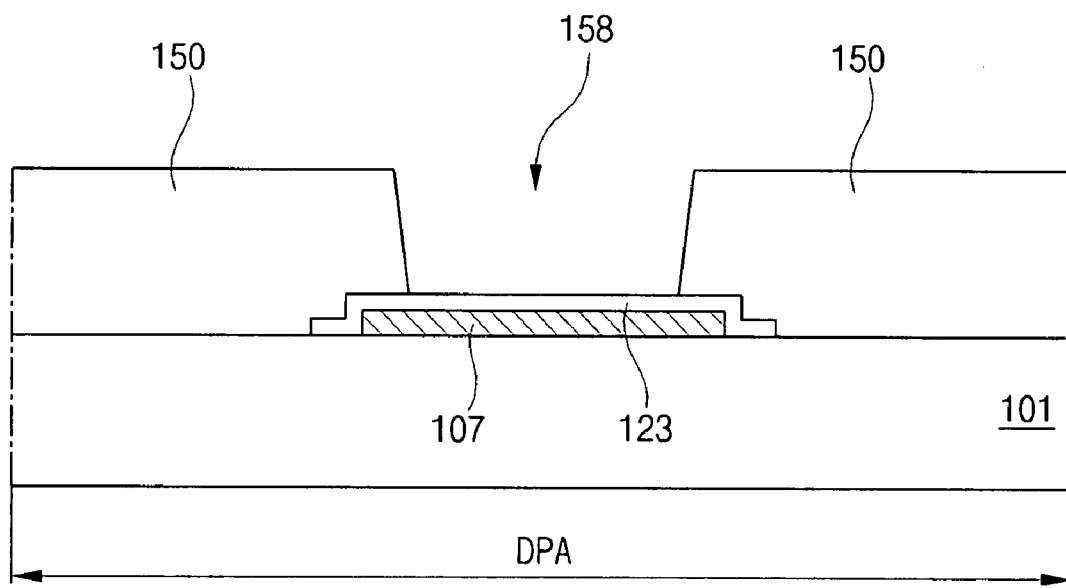

As shown in FIGS. 6E and 7E, a passivation layer 150 is formed on the TFT "Tr," the pixel electrode 120, the data line 105 and the data pad terminal 123 by coating an organic insulating material such as benzocyclobutene (BCB), photo acryl, polyvinyl alcohol (PVA) and fluoropolymer. The passivation layer 150 includes a gate contact hole 155 exposing the gate electrode 145 and a data pad contact hole 158 exposing the data pad terminal 123 in the data pad area "DPA." The gate contact hole 155 and the data pad contact hole 158 may be formed in the passivation layer 150 through a photolithographic process using a photoresist pattern as an etch mask. When the organic insulating material has a photosensitivity, the gate contact hole 155 and the data pad contact hole 158 may be formed through exposure and development that omits the use of an additional photoresist pattern as an etch mask.

In an alternate embodiment, the passivation layer 150 additionally has an open portion exposing the pixel electrode 120 in the pixel region "P." The passivation layer 150 of the organic insulating material may have a greater thickness than a passivation layer of an inorganic insulating material. If the passivation layer 150 of an organic insulating material covers the pixel electrode 120, the intensity of an electric field generated between the pixel electrode 120 and a common electrode of a color filter substrate may be reduced due to the passivation layer 150 covering the pixel electrode 120. The reduction in intensity of the electric field may be prevented or reduced by forming an opening in the passivation layer 150.

Figure 6F:
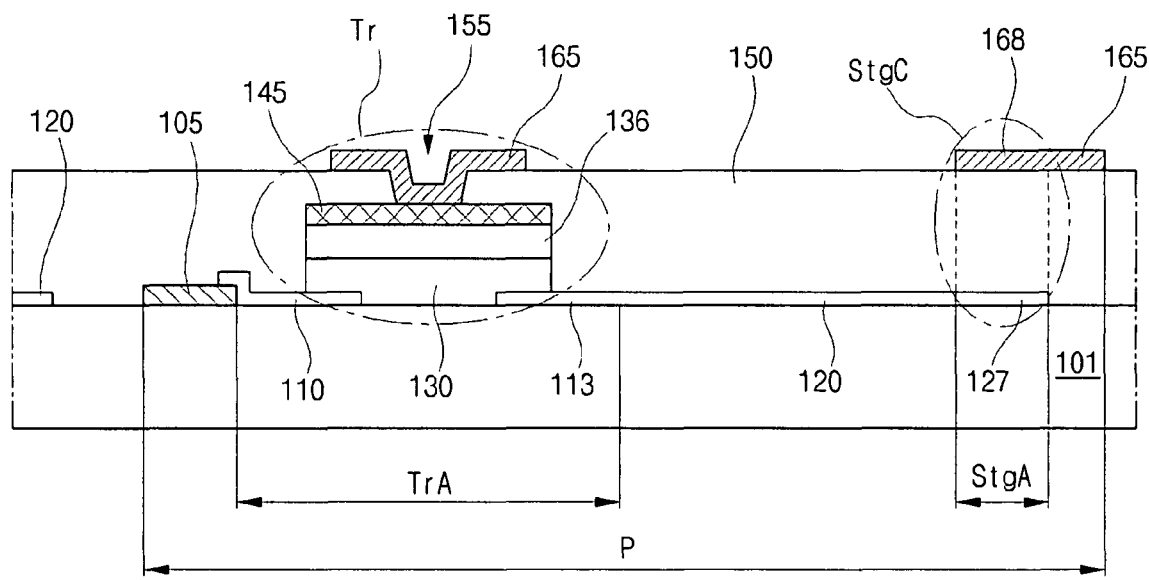
Figure 7F:
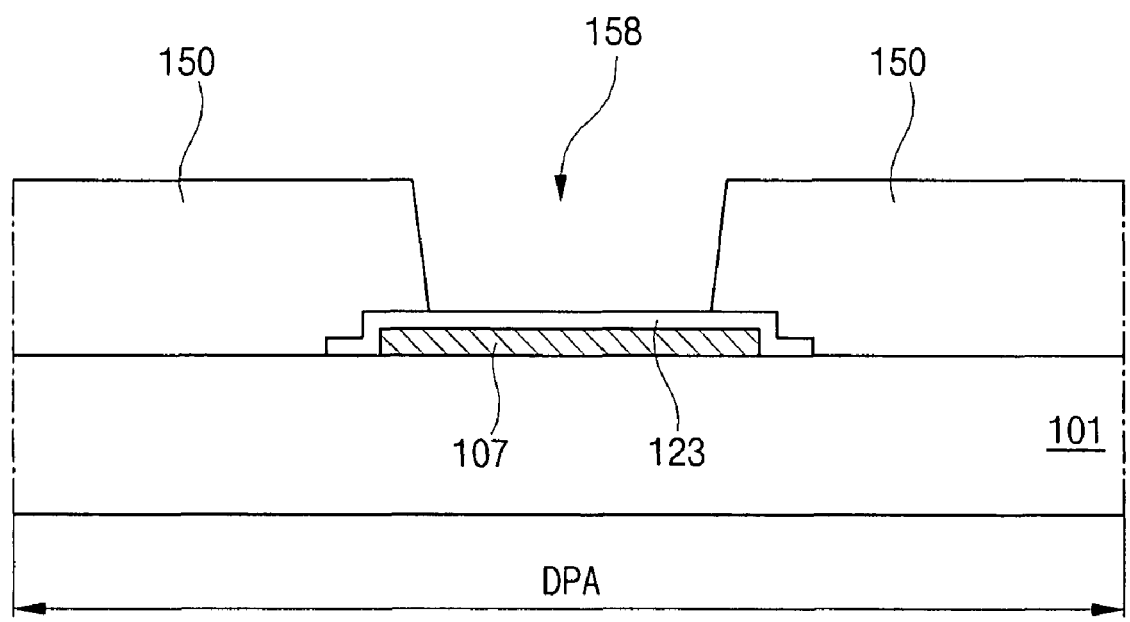

Referring to FIGS. 6F and 7F, a gate line 165 and a gate pad are formed on the passivation layer 150 by depositing a third metallic material such as silver (Ag), aluminum (Al), aluminum (Al) alloy, molybdenum (Mo), copper (Cu), copper (Cu) alloy and chromium (Cr) onto the passivation layer. The third metallic material having a relatively low resistance may be deposited onto the passivation layer 150 using a sputtering method at a temperature lower than about 200° C. The gate line 165 is connected to the gate electrode 145 through the gate contact hole 155 and defines the pixel region "P" through a crossing with the data line 105. The gate pad is connected to one end of the gate line 165.

Further, the gate line 165 corresponding to an adjacent pixel region, and which may be referred to as a previous gate line, overlaps the pixel electrode 120 in the pixel region "P" to constitute a storage capacitor "StgC." Accordingly, the storage capacitor "StgC" includes a first capacitor electrode 127 that is an overlapped portion of the pixel electrode 120, a dielectric layer that is a portion of the passivation layer 150 and a second capacitor electrode 168 that is an overlapped portion of the previous gate line.

Figure 8:
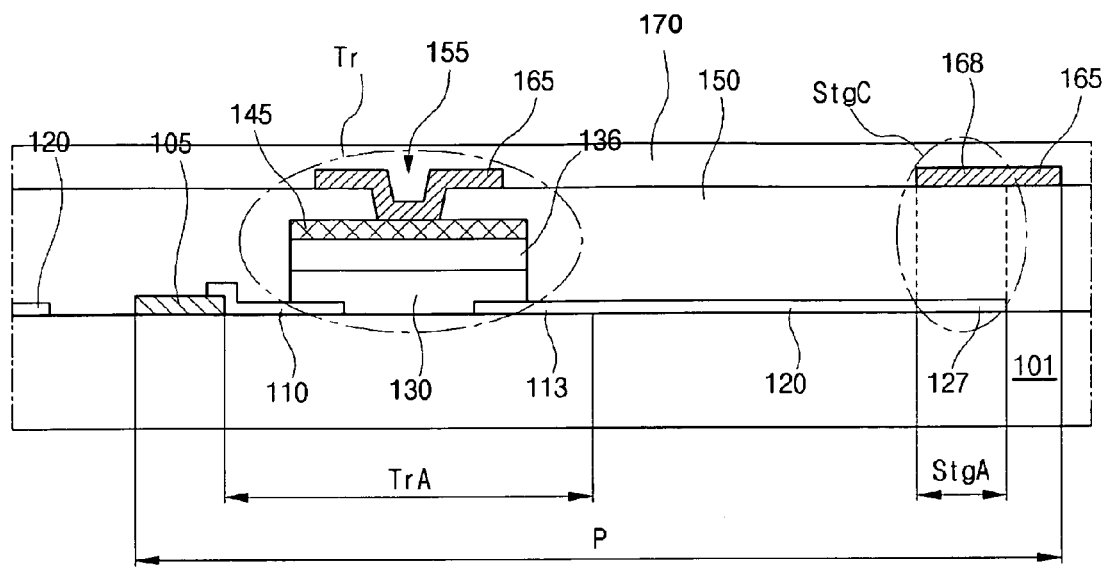
FIG. 8 is a cross-sectional view showing an array substrate according to another embodiment of the present invention.
Figure 9:
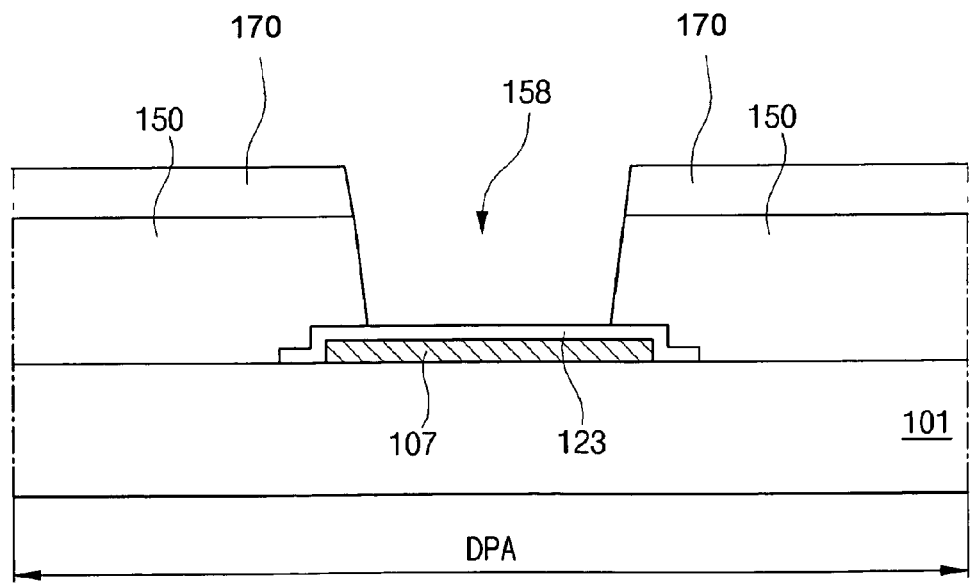
FIG. 9 is a cross-sectional view showing a data pad area of an array substrate according to another embodiment of the present invention.

In another embodiment, as shown in FIG. 8 and FIG. 9, an auxiliary passivation layer 170 may be formed on the gate line 165. The auxiliary passivation layer 170 may have a gate pad contact hole exposing the gate pad and a data pad terminal hole exposing the data pad terminal 123. The data pad terminal hole may be connected to the data pad contact hole 158 in the passivation layer 150. In addition, the auxiliary passivation layer 170 further has an auxiliary open portion exposing the pixel electrode 120.

In the array substrate 101 for an LCD device according to an embodiment of the present invention, the source and drain electrodes 110 and 113 contacting the organic semiconductor layer 130 are formed of a transparent conductive material such as indium-tin-oxide (ITO) rather than of gold (Au). Although indium-tin-oxide (ITO) has a lower work function than gold (Au), indium-tin-oxide (ITO) has a much higher work function than other metallic materials. As a result, degradation in the properties of the TFT "Tr" due to difficulty of obtaining a designed line width and poor adhesion may be minimized and production yield may be improved. In addition, since indium-tin-oxide (ITO) is relatively inexpensive in comparison to gold (Au) is used, production cost may be reduced.

It will be apparent to those skilled in the art that various modifications and variations can be made in an array substrate for a liquid crystal display device, the method of fabricating the array substrate of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
   a data line on a substrate;
   a source electrode contacting and overlapping the data line, a drain electrode spaced apart from the source electrode and a pixel electrode connected to the drain electrode, wherein the source electrode, the drain electrode and the pixel electrode each include transparent conductive material;
   a data pad at one end of the data line, wherein the data pad is disposed in a same layer as the data line;
   a data pad terminal on the data pad, wherein the data pad terminal includes a same material as the source and drain electrodes and the data pad terminal is disposed in a same layer as the source and drain electrodes;
   an organic semiconductor layer contacting the source and drain electrodes;
   a gate insulating layer on the organic semiconductor layer;
   a gate electrode on the gate insulating layer;
   a first passivation layer on the gate electrode, the first passivation layer having a gate contact hole exposing the gate electrode; and
   a gate line on the first passivation layer, the gate line connected to the gate electrode through the gate contact hole.

2. The array substrate according to claim 1, wherein the transparent conductive material includes indium-tin-oxide (ITO).

3. The array substrate according to claim 1, wherein the source and drain electrodes each include a material having a higher work function than a material of the data line.

4. The array substrate according to claim 1, wherein the pixel electrode extends from the drain electrode.

5. The array substrate according to claim 1, wherein the gate insulating layer and the gate electrode have substantially a same shape as the organic semiconductor layer.

6. The array substrate according to claim 1, further comprising a gate pad at one end of the gate line.

7. The array substrate according to claim 6, wherein the first passivation layer further has a data pad contact hole exposing the data pad terminal and an open portion exposing the pixel electrode.

8. The array substrate according to claim 1, wherein the gate line and the pixel electrode overlap each other to form a storage capacitor.

9. The array substrate according to claim 1, further comprising a second passivation layer on the gate line.

10. Original) The array substrate according to claim 1, further comprising a buffer layer between the substrate and the organic semiconductor layer, wherein the buffer layer has a hydrophilic property.

11. A method of fabricating an array substrate for a liquid crystal display device, comprising:
    forming a data line on a substrate;
    forming a source electrode contacting and overlapping the data line, a drain electrode spaced apart from the source electrode and a pixel electrode extending from the drain electrode, wherein the source electrode, the drain electrode and the pixel electrode each include a transparent conductive material;
    forming a data pad at one end of the data line;
    forming a data pad terminal on the data pad, wherein the data pad terminal is formed simultaneously with the source and drain electrodes;
    forming an organic semiconductor layer contacting the source and drain electrodes, a gate insulating layer on the organic semiconductor layer and a gate electrode on the gate insulating layer;
    forming a first passivation layer on the gate electrode, the first passivation layer having a gate contact hole exposing the gate electrode; and
    forming a gate line on the first passivation layer, the gate line connected to the gate electrode through the gate contact hole.

12. The method according to claim 11, wherein the transparent conductive material includes indium-tin-oxide (ITO).

13. The method according to claim 11, further comprising treating the source and drain electrodes with oxygen (O2) plasma.

14. A method of fabricating an array substrate for a liquid crystal display device, comprising:
   forming a data line on a substrate;
   forming a source electrode contacting and overlapping the data line, a drain electrode spaced apart from the source electrode and a pixel electrode extending from the drain electrode, wherein the source electrode, the drain electrode and the pixel electrode each include a transparent conductive material;
   forming an organic semiconductor layer contacting the source and drain electrodes, a gate insulating layer on the organic semiconductor layer and a gate electrode on the gate insulating layer;
   forming a first passivation layer on the gate electrode, the first passivation layer having a gate contact hole exposing the gate electrode; and
   forming a gate line on the first passivation layer, the gate line connected to the gate electrode through the gate contact hole,
   wherein forming the organic semiconductor layer, the gate insulating layer and the gate electrode includes:
   forming an organic semiconductor material layer on the source electrode, the drain electrode and the pixel electrode;
   forming an organic insulating material layer on the organic semiconductor material layer;
   forming a metallic material layer on the organic insulating material layer;
   forming a photoresist pattern on the metallic material layer;
   patterning the metallic material layer using the photoresist pattern as an etch mask through a first etching process;
   removing the photoresist pattern; and
   patterning the organic insulating material layer and the organic semiconductor material layer using the gate electrode as an etch mask through a second etching process.

15. The method according to claim 14, wherein the organic semiconductor material layer is formed using one of an inkjet coating method, a nozzle coating method, a bar coating method, a slit coating method, a spin coating method and a printing method.

16. The method according to claim 11, further comprising forming a gate pad at one end of the gate line.

17. The method according to claim 16, wherein the first passivation layer further has a data pad contact hole exposing the data pad terminal and an open portion exposing the pixel electrode.

18. The method according to claim 11, wherein the gate line and the pixel electrode overlap each other to form a storage capacitor.

19. The method according to claim 11, further comprising forming a second passivation layer on the gate line.

20. The method according to claim 11, further comprising forming a buffer layer between the substrate and the organic semiconductor layer, wherein the buffer layer has a hydrophilic property.

* * * * *